United States Patent
Cok (10) Patent No.: US 8,665,247 B2
(45) Date of Patent: Mar. 4, 2014

(54) FLEXIBLE DISPLAY

(75) Inventor: Ronald S. Cok, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 622 days.

(21) Appl. No.: 10/449,375

(22) Filed: May 30, 2003

(65) Prior Publication Data
US 2004/0239586 A1    Dec. 2, 2004

(51) Int. Cl.
*G09G 3/32*    (2006.01)
*G09G 5/00*    (2006.01)
*G02F 1/13*    (2006.01)

(52) U.S. Cl.
USPC ....... 345/204; 345/79; 315/169.1; 315/169.3; 349/149

(58) Field of Classification Search
USPC ............... 345/30, 55, 59, 7, 2, 76, 80, 82, 94, 345/98–100, 103, 690, 204–206, 83, 72, 89, 345/79; 250/552, 553; 315/169.1, 169.3; 340/815.45, 815.56, 815.65; 349/38, 349/44, 138, 141, 149, 187, 139; 257/40, 257/59, 72, 300; 445/46; 438/29, 155, 455; 178/18.03, 18.06, 18.09
See application file for complete search history.

(56) References Cited

U.S. PATENT DOCUMENTS

| | | | |
|---|---|---|---|
| 4,769,292 A | | 9/1988 | Tang et al. |
| 4,982,183 A * | | 1/1991 | Flegal et al. ..................... 345/79 |
| 5,061,569 A | | 10/1991 | VanSlyke et al. |
| 5,164,853 A * | | 11/1992 | Shimazaki ....................... 349/73 |
| 6,259,838 B1 * | | 7/2001 | Singh et al. ..................... 385/31 |
| 6,366,026 B1 * | | 4/2002 | Saito et al. ................. 315/169.3 |
| 6,518,709 B2 * | | 2/2003 | Iketsu et al. ................ 315/169.3 |
| 6,551,711 B1 | | 4/2003 | Bell et al. |
| 6,667,791 B2 * | | 12/2003 | Sanford et al. ................. 349/139 |
| 6,693,384 B1 * | | 2/2004 | Vicentini et al. ............ 315/169.1 |
| 6,709,901 B1 * | | 3/2004 | Yamazaki et al. ............. 438/149 |
| 6,787,249 B2 * | | 9/2004 | Seo ................................ 428/690 |
| 6,897,855 B1 * | | 5/2005 | Matthies et al. ............... 345/204 |
| 6,905,784 B2 * | | 6/2005 | Seo ................................ 428/690 |
| 2001/0015788 A1 | | 8/2001 | Mandai et al. |
| 2002/0030784 A1 | | 3/2002 | Onaka et al. |
| 2002/0044782 A1 * | | 4/2002 | Kota et al. ...................... 396/661 |
| 2002/0061392 A1 | | 5/2002 | Jacobsen et al. |
| 2002/0122349 A1 | | 9/2002 | Kobayashi |
| 2002/0126082 A1 | | 9/2002 | Matsuzaki |
| 2002/0135726 A1 | | 9/2002 | Sakaki et al. |
| 2002/0142504 A1 * | | 10/2002 | Feldman et al. ................. 438/30 |
| 2002/0186210 A1 | | 12/2002 | Itoh |
| 2002/0196402 A1 | | 12/2002 | Sanford et al. |
| 2003/0015960 A1 * | | 1/2003 | Seo et al. ........................ 313/504 |
| 2003/0034497 A1 | | 2/2003 | Yamazaki et al. |
| 2003/0040149 A1 * | | 2/2003 | Kasai ............................. 438/200 |
| 2003/0048256 A1 | | 3/2003 | Salmon |
| 2003/0063452 A1 | | 4/2003 | Satonaka |
| 2003/0068842 A1 | | 4/2003 | Tojo et al. |
| 2003/0076460 A1 * | | 4/2003 | Murade ......................... 349/111 |

* cited by examiner

*Primary Examiner* — Quan-Zhen Wang
*Assistant Examiner* — Michael J Eurice
(74) *Attorney, Agent, or Firm* — Global OLED Technology LLC (57) ABSTRACT

A flat panel display includes a flexible substrate; a passive matrix display having an array of pixels formed on a side of the flexible substrate, and row and column electrodes formed on the same side of the flexible substrate and connected to the pixels for providing data and selection signals to the pixel elements; a plurality of electrical contacts formed on the same side of the substrate and electrically connected to the row and column electrodes; and discrete data and selection drivers located on the same side of the flexible substrate around the periphery of the passive matrix display and electrically connected to the electrical contacts for driving the pixels of the passive matrix display.

7 Claims, 7 Drawing Sheets

FLEXIBLE DISPLAY

FIELD OF THE INVENTION

The present invention relates to flat panel displays and, more particularly, to displays having a flexible substrate.

BACKGROUND OF THE INVENTION

Flat panel display devices are widely used in today's mobile, computer centric society. These displays are typically formed on rigid substrates and use a variety of light modulation techniques (such as liquid crystal display, organic light emitting diodes, and plasma) to form images. These displays suffer from limitations in substrate size due to manufacturing technology, materials, and interconnection limitations, and limitations in application due to the use of rigid substrates.

Display devices having flexible substrates are under development by a wide variety of companies. However, these displays are typically limited in performance due to the difficulty of forming active matrix switching circuitry on flexible substrates. Such flexible switching circuits are not yet commercially available; see for example U.S. Pat. No. 6,551,717 B2 issued Apr. 22, 2003 to Bell et al., describing an organic semi-electrode film fabricated by applying a solution containing an organic semi-electrode material and a solvent to a substrate. The resultant organic semi-electrode film contains a large area that exhibits a relatively high charge carrier.

Alternatively, passive matrix display designs that do not include switching circuitry on the display substrate may be used but are limited to a smaller number of light emitting elements and are not useful for video capable, full color displays. The brightness of passive matrix displays is also limited, particularly for large displays, by limited electrode conductivity and the need for high current and refresh rates to reduce display flicker. For example, the resolution of passive matrix OLED displays is typically limited to about 100-200 rows for 100 candelas/m$^2$ display brightness levels.

In a passive matrix display, only one row at a time is active, the rows are sequentially activated at a high frequency to create the illusion of a continuous display. As a consequence, the pixels must be very bright when activated to maintain the brightness of the display and to prevent the appearance of display flicker. In order to achieve this brightness, the row and column electrodes must have high conductivity to minimize voltage drops along the row electrode. Either the row or column electrodes must be transparent above or below the pixel to allow light to escape from the pixel. This transparency limits the current carrying capability of the electrode. The role of the row and column electrodes can be interchanged.

US 2002/0196402 A1 by Sanford et al., published Dec. 26, 2002, describes an OLED display that includes a substrate, a display element disposed on the substrate, the display element having: a first electrical electrode; a second electrical electrode; a light switching material disposed between the first electrical electrode and the second electrical electrode; and a via through the substrate for electrically coupling a signal to the first electrical electrode. However, this approach to solving the difficulties of an OLED passive-matrix display is not suitable for a flexible substrate since the use of vias imposes manufacturing problems such as difficulty in hermetically sealing the display.

The use of conventional electronic components on a flexible substrate to form flexible computers is known. For example, US 2003/0048256 A1 by Salmon, published Mar. 13, 2003, describes techniques for building lightweight computing devices that may weigh less than one pound. The computing device may include a motherboard, a keyboard, and a display. Alternatively it may include a motherboard, a display, and speech processing capabilities. The motherboard is preferably built on a flexible substrate using a rigid carrier. IC (integrated circuit) chips are attached using flip chip bonds that employ stud bumps on the IC chips, and corresponding wells filled with solder on the motherboard. However, such a system uses a motherboard with additional boards, increasing the size of the system and the expense of manufacturing, and does not address problems with flexible displays.

The use of organic light emitting diode technology on a flexible substrate to form a display is also known. For example, US 2003/0034497 A1 by Yamazaki et al., published Feb. 20, 2003, describes a light emitting device including an OLED formed on a plastic substrate, where the plastic substrate comprises a plurality of barrier films and a laminate structure. This technology does not address the problem of display interconnection or switching circuitry on a flexible substrate.

It is also known to combine a flexible substrate with conductive elements connecting small, integrated circuits. For example, US 2002/0061392 A1 by Jacobsen et al., published May 23, 2002, describes apparatuses and methods for forming displays. One embodiment of the invention relates to depositing a plurality of blocks onto a substrate and coupling a flexible layer having interconnect deposited thereon. Another embodiment of the invention relates to forming a display along a length of a flexible layer wherein a slurry containing a plurality of elements with circuit elements thereon washes over the flexible layer and slides into recessed regions or holes found in the flexible layer. Interconnect is then deposited thereon. In another embodiment, interconnect is placed on the flexible layer followed by a slurry containing a plurality of elements. However, this design requires a multiplicity of light emitting circuit elements that reduces the resolution and increases the size of a display and requires a more complex manufacturing process.

There is a need therefore for an improved flat panel flexible display device.

SUMMARY OF THE INVENTION

The need is met according to the invention by providing a flat panel display that includes a flexible substrate; a passive matrix display having an array of pixels formed on a side of the flexible substrate, and row and column electrodes formed on the same side of the flexible substrate and connected to the pixels for providing data and selection signals to the pixel elements; a plurality of electrical contacts formed on the same side of the substrate and electrically connected to the row and column electrodes; and discrete data and selection drivers located on the same side of the flexible substrate around the periphery of the passive matrix display and electrically connected to the electrical contacts for driving the pixels of the passive matrix display.

Advantages

The present invention has the advantage of providing a flat panel display device on a flexible substrate that does not require the formation of integrated circuits on the flexible substrate.

DETAILED DESCRIPTION OF THE INVENTION

Figure 1:
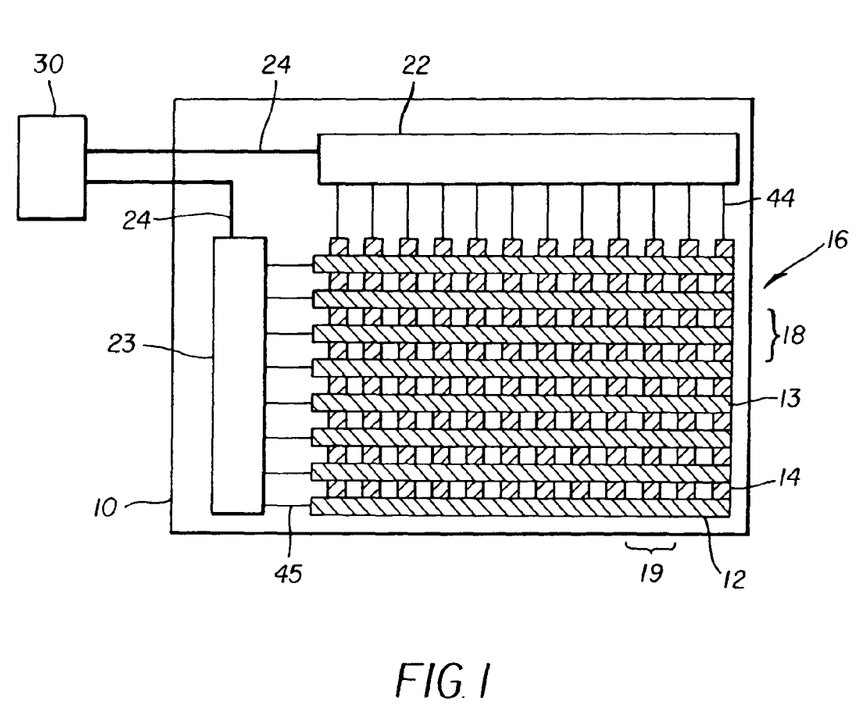
FIG. 1 is a schematic diagram of passive matrix display according to one embodiment of the present invention.

Referring to FIG. 1, a flexible display device according to the present invention includes a flexible substrate 10. Row electrodes 12 and column electrodes 14 formed on one side of the flexible substrate 10 define rows 18 and columns 19 of passive matrix pixel elements 13 where the row and column electrodes overlap. The row and column electrodes 12 and 14 provide data and selection signals to the array 16 of passive matrix pixel elements 13. The row electrodes 12 and column electrodes 14 are connected to electrical contacts 44 and 45 respectively. Discrete data drivers 22 and selection drivers 23 are located on the flexible substrate around the periphery of the array 16 and are electrically connected to the electrical contacts 44 and 45. The discrete data and selection drivers 22 and 23 are conventional integrated circuits formed on separate, discrete and rigid substrates (such as silicon) separate from the flexible substrate 10 and are attached onto the same side of the flexible substrate 10 as row and column electrodes 12 and 14. The discrete data drivers 22 and selection drivers 23 drive the pixel elements 13 using a passive matrix control scheme and respond to address and data control signals provided by a display controller 30 through address, data, and control lines 24. The data values can be written into the data drivers 22 using conventional memory writing techniques using the address data and control lines. Alternatively the data values can be written into the data driver 22 by serially writing the data into the data drivers using a serial shift register.

Figure 2:
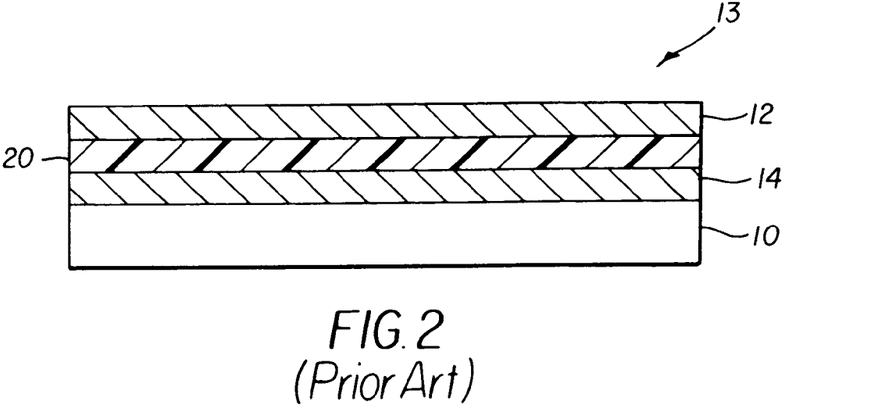
FIG. 2 is a schematic diagram illustrating a prior art OLED.

Referring to FIG. 2, the pixels of an emissive display, such as an OLED display, can be formed upon a flexible substrate 10. Layers of light emissive OLED materials 20 are placed between the electrodes 12 and 14 as is known in the prior art. For example, the layers may include hole injection, hole transport, emissive, electron transport and electron injection layers. When an OLED element is energized through one column 19 and one row 18 (see FIG. 1), the OLED element at the column and row intersection is energized and light is emitted. With this design, an entire row or column of OLED elements may be energized simultaneously, but only one row or column may be active at one time.

Figure 3:
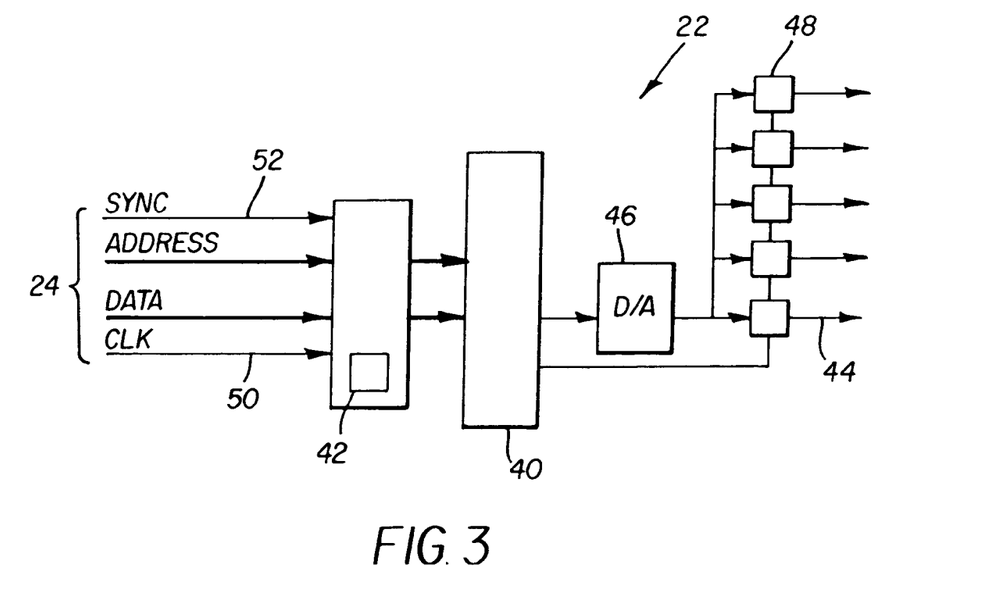
FIG. 3 is a schematic circuit diagram of a data driver useful with the present invention.

Referring to FIG. 3, the discrete data drivers 22 include a memory 40 storing a brightness value for each pixel 13 on the columns 19. The values are written to the driver circuit 22 through address, data, and control lines 24 by a display controller 30. Once stored in the memory 40, an address generator or timing controller 42 scans through the values in the memory 40 and sequentially applies the value to a driver element 48 for each column 19 where it is stored and presented on electrical contact 44. The values maybe stored in analog form in the memory 40 or as digital values. If the values are stored as digital values, they may be converted to analog voltages or currents through a digital-to-analog converter 46, as shown.

Figure 4:
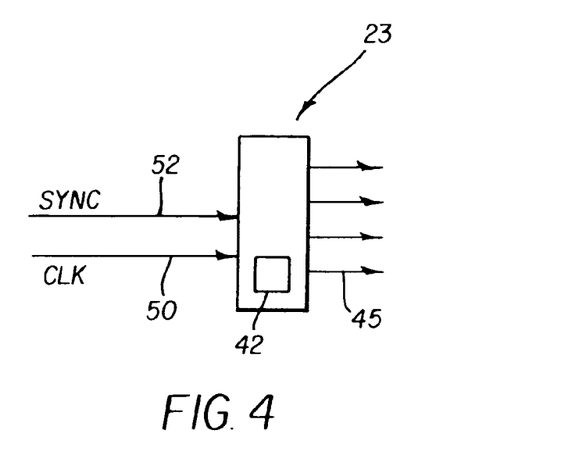
FIG. 4 is a schematic circuit diagram of a selection driver useful with the present invention.

The discrete selection driver 23 selects the row 18 on which data is displayed. Referring to FIG. 4, a simpler selection driver 23 is synchronized with the driver circuit 22 through the clock 50 and sync signal 52. For smaller displays with fewer lines, the simpler driver circuit 23 may be integrated into the driver circuit 22. Alternatively, if the array 16 is divided into separately addressable regions as described below, the drivers 22 and 23 may be integrated.

In operation, the controller 30 provides data in the form of address and data signals corresponding to the light emitted at each pixel location 13 and deposits the data into the data drivers 22. Using the sync 52 and clock 50 signals to synchronize the drivers 22 and 23, data (column) drivers 22 present the data for the first row of pixels and the corresponding selection (row) driver 23 activates all of the pixels within the row simultaneously to display one row of pixels. In a second cycle, the data drivers 22 present the data for the second row of pixels and the selection driver 23 activates the second row, and so forth for each row. These circuits may be made using conventional integrated circuit technologies using conventional, rigid substrates.

Figure 5:
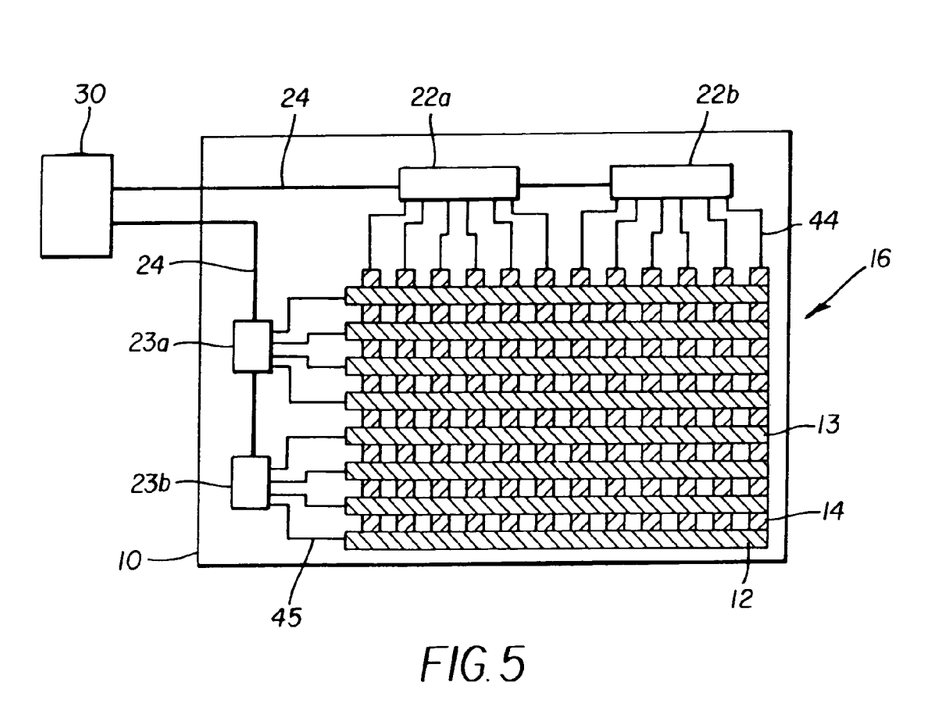
FIG. 5 is a schematic diagram of a passive matrix display according to an alternative embodiment of the present invention.
Figure 6:
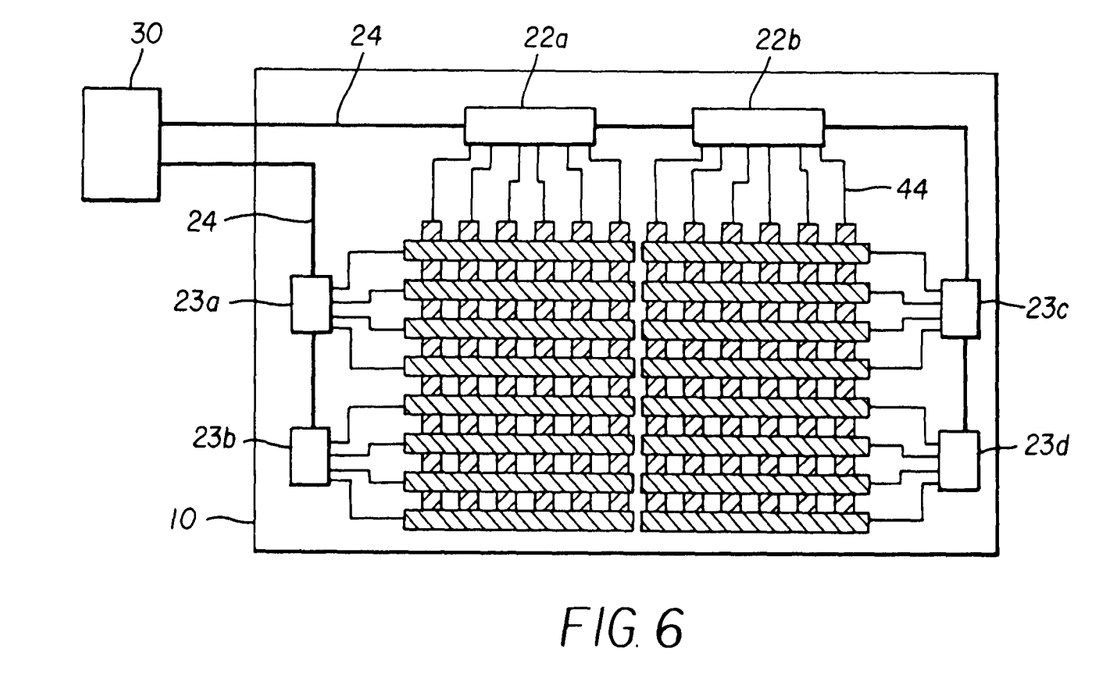
FIG. 6 is a schematic diagram of a passive matrix display according to a further alternative embodiment of the present invention.

It is known that column 14 and row 12 electrodes suffer when they are long or have low conductivity. The length of the row electrodes 12 may be reduced through the use of a plurality of discrete drivers to drive the various row and column electrodes. Referring to FIG. 5, data drivers 22a and 22b each drive one half of the columns 19 and selection drivers 23a and 23b each drive one half of the rows 18. The use of a plurality of discrete drivers located closer to the electrodes enables the construction of a physically larger display area by reducing the total distance from a driver to the last pixel 13 connected to an electrode. Referring to FIG. 6, selection drivers 23a, 23b, 23c, and 23d further reduce the total length of the row electrodes 18 by driving one quarter of the rows with each selection driver respectively. Moreover, the number of output driver lines from the drivers 22 and 23 is limited, so that additional discrete drivers may be needed to drive all of the rows 18 and columns 19 of the array 16. Hence, it is advantageous to use a plurality of discrete drivers.

The rate, and hence the brightness and current, at which the pixel elements 13 must be refreshed is a function of the number of rows to which data can be simultaneously applied. To enable a higher refresh rate, the array 16 of pixels 13 may be divided into separate, addressable regions on which data can be simultaneously displayed.

Figure 7:
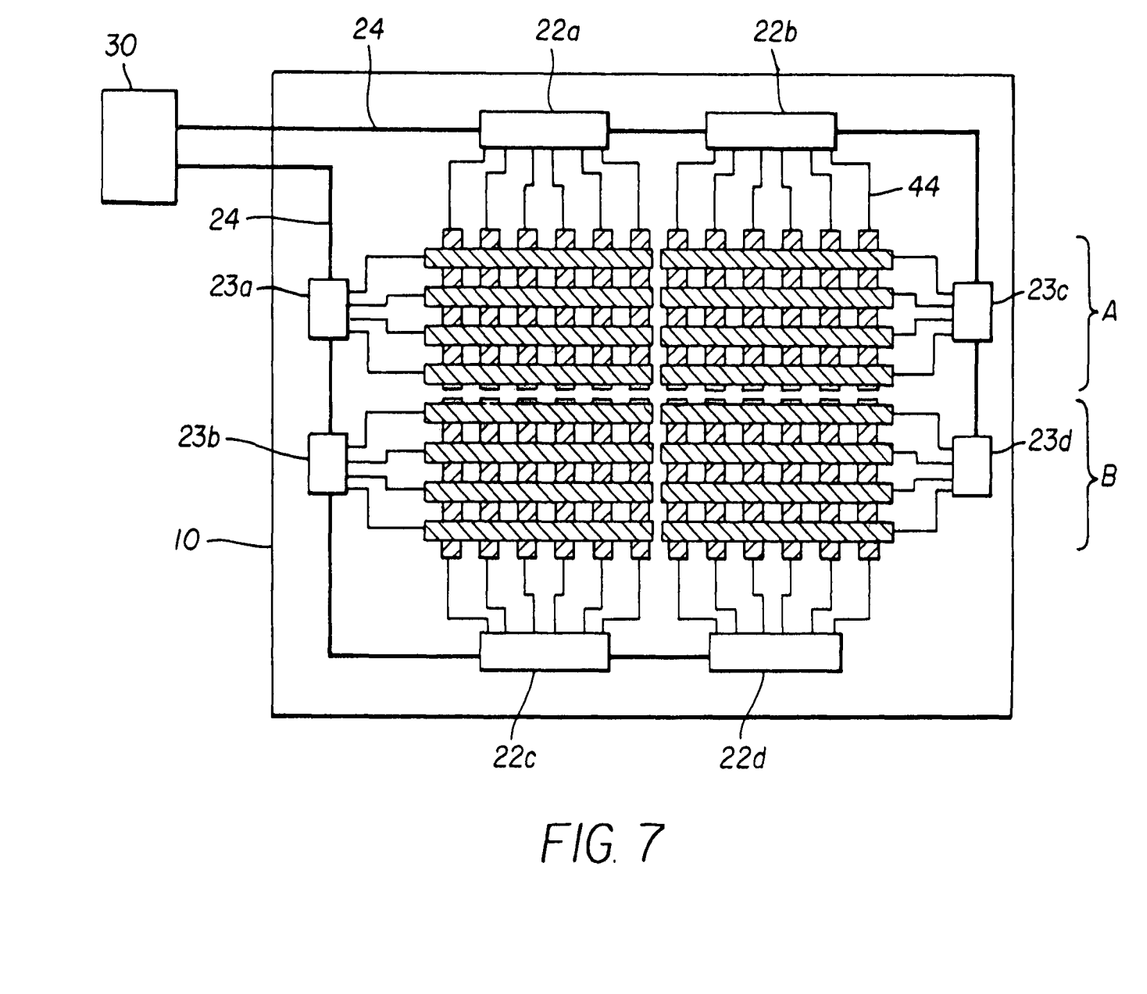
FIG. 7 is a schematic diagram of a passive matrix display according to a further alternative embodiment of the present invention.
Figure 8:
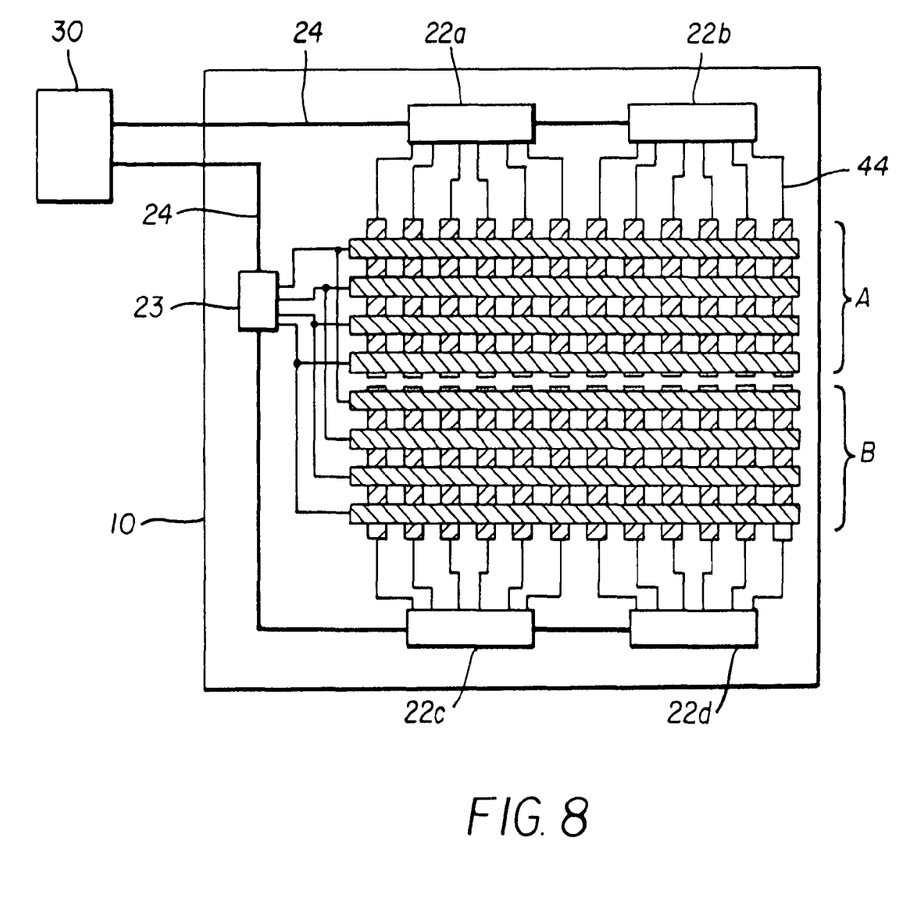
FIG. 8 a schematic diagram of a passive matrix display according to a further alternative embodiment of the present invention.

Referring to FIG. 7, the array is divided into two portions A and B on which data can be simultaneously displayed. Portion A is driven by data drivers 22a and 22b while portion B is driven by data drivers 22c and 22d. Thus, for example, the first row of portion A can be written at the same time as the first row of portion B, thereby doubling the display rate (or halving the refresh rate) of the display and doubling the size of a larger passive matrix display array. Note that common row selection signals can be employed between the two portions A and B, as shown in FIG. 8, reducing the number of selection drivers 23 at the expense of longer row electrodes 12.

Figure 9:
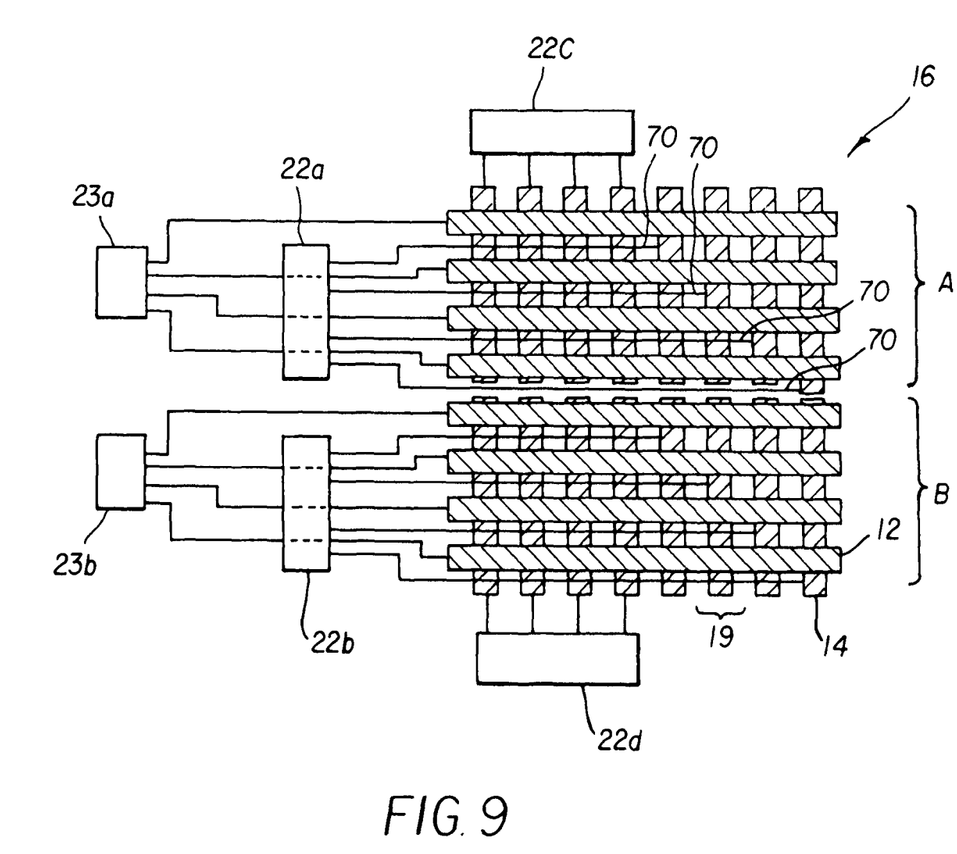
FIG. 9 is a schematic diagram of a portion of a passive matrix display according to a further alternative embodiment of the present invention.

Referring to FIG. 9, the array 16 may be divided into further, smaller separately addressable regions. This may be done by routing conductors 70 connected to the column electrodes 14 to the periphery of the array 16 and connecting them to discrete data drivers 22*a* and 22*b* and selection drivers 23*a* and 23*b*. As noted above, with layouts of this type, the data and selection drivers may be integrated onto one discrete chip to reduce costs and improve layouts.

The process of reducing the array into ever smaller, separate addressable regions can be continued and is limited by cost of drivers, the number of pins that can be provided, and the space to route conductors 70. By reducing the size of the electrodes 12 more conductors 70 can be accommodated, enabling the division of the array 16 into separately addressable regions within the interior of the array 16. Reducing the size of electrodes 12 reduces the fill factor of the display but enables passive matrix displays with a larger number of elements. Applicant has performed experiments demonstrating that for displays with a resolution of more than 100 pixels per inch, reducing the fill factor does not greatly reduce the perceived image quality of the display.

The display of the present invention may be constructed by first providing a flexible substrate 10 with suitable barrier layers to prevent the migration of moisture through the substrate. Conductive electrodes 12 and 14 and conductors 70 together with insulating materials are patterned on the substrate and suitable emissive materials are patterned and deposited on the electrodes, for example OLED materials. The emissive materials may comprise multiple layers. A second electrode is then patterned and deposited above the emissive materials to form light emitting pixels 13. Driver circuits 22 and 23 are separately manufactured using conventional integrated circuit technology. These circuits are positioned on the same side of the flexible substrate as the light emitters and may be connected to the electrodes 12 and 14 using a variety of known techniques, for example, wire bonding from the substrate of an unpackaged chip or using surface mount or flip chip techniques. The substrate is then encapsulated and provided with a connector and a controller 30 to complete the display. The encapsulation may be provided over the drivers 22 and 23 at the same time. Alternatively, the encapsulation may be done in stages or extend only to the periphery so as to enable a variety of bonding and encapsulation processes for the drivers 22 and 23.

The display may emit light either through the substrate or through the encapsulation. Electrode 12 or 14 must be transparent in the light emitting areas to allow light to escape from the display but may be thicker and more highly conductive elsewhere on the substrate.

In a preferred embodiment, the invention is employed in a device that includes Organic Light Emitting Diodes (OLEDs) which are composed of small molecule or polymeric OLEDs as disclosed in but not limited to U.S. Pat. No. 4,769,292, issued Sep. 6, 1988 to Tang et al. and U.S. Pat. No. 5,061,569, issued Oct. 29, 1991 to VanSlyke et al. Many combinations and variations of organic light emitting displays can be used to fabricate such a device.

In various embodiments of the invention, the data drivers may include memory for storing a frame of data, the data drivers may drive the display at a rate greater than a frame refresh rate, the display may be a color display, and the discrete data and selection drivers may be packaged in surface mount packages.

The invention has been described in detail with particular reference to certain preferred embodiments thereof, but it will be understood that variations and modifications can be effected within the spirit and scope of the invention.

PARTS LIST

A,B individually addressable region
10 flexible substrate
12 row electrode
13 pixel element
14 column electrode
16 array
18 rows
19 column
20 OLED material
22, *a, b, c, d* data driver
23, *a, b, c, d* row driver
24 control lines
30 controller
40 memory
42 address generator
44 electrical contacts
45 electrical contacts
46 digital to analog converter
48 driver element
50 clock
52 sync
70 conductors

What is claimed is:

1. A flat-panel display, comprising:
   a) a single flexible substrate having first and second sides;
   b) a passive matrix display, the passive matrix display having an array of pixels, row electrodes, and column electrodes, the array of pixels, row electrodes, and column electrodes formed on the first side of the single flexible substrate, the row and column electrodes connected to the array of pixels for providing a data signal and a selection signal to each pixel in the array of pixels;
   c) a plurality of electrical contacts also formed on the first side of the single substrate, the plurality of electrical contacts electrically connected to the row and column electrodes;
   d) at least four discrete data drivers and at least four discrete selection drivers located on the first side of the single substrate around a periphery of the passive matrix display,
   the at least four discrete data drivers and the at least four discrete selection drivers electrically connected to the electrical contacts for driving the array of pixels wherein the array of pixels includes at least four separately, simultaneously, and independently addressable two-dimensional regions,
      wherein each two-dimensional region is driven by a different pair of discrete data and selection drivers such that the data can be simultaneously displayed,
      wherein the discrete data and selection drivers are integrated circuits formed on separate rigid substrates different from the single flexible substrate; and
      wherein the at least four discrete data drivers includes a controller for providing address values and data values; and
   e) encapsulation that covers both the discrete data and selection drivers.

2. The flat panel display claimed in claim 1, wherein the pixels are organic light-emitting diodes.

3. The flat panel display claimed in claim 1, wherein the passive matrix display is a color display.

4. The flat panel display claimed in claim 1, wherein the data drivers include an analog memory for storing data.

5. The flat panel display claimed in claim 1, wherein the at least four data drivers include a digital memory for storing the data and a digital to analog converter for converting the data to analog form.

6. The flat panel display claimed in claim 1, wherein the at least four discrete data drivers include a memory for storing a frame of data.

7. The flat panel display claimed in claim 6, wherein the at least four discrete data drivers drive the passive matrix display at a rate greater than a frame refresh rate.

* * * * *